(12) United States Patent
Tanaka et al.

(10) Patent No.: US 9,273,838 B2
(45) Date of Patent: Mar. 1, 2016

(54) LIGHT-EMITTING MODULE AND LIGHTING APPARATUS

(75) Inventors: Toshiya Tanaka, Yokohama (JP); Akiko Saito, Yokohama (JP); Hitoshi Kawano, Yokohama (JP)

(73) Assignees: Toshiba Lighting & Technology Corporation, Kanagawa-ken (JP); Kabushiki Kaisha Toshiba, Minato-ku, Tokyo (JP)

( * ) Notice: Subject to any disclaimer, the term of this patent is extended or adjusted under 35 U.S.C. 154(b) by 265 days.

(21) Appl. No.: 13/587,225

(22) Filed: Aug. 16, 2012

(65) Prior Publication Data

US 2012/0306352 A1 Dec. 6, 2012

Related U.S. Application Data

(63) Continuation of application No. 12/867,134, filed as application No. PCT/JP2009/052382 on Feb. 13, 2009.

(30) Foreign Application Priority Data

Feb. 14, 2008 (JP) .................. 2008-033673
Apr. 30, 2008 (JP) .................. 2008-118292

(51) Int. Cl.
*F21S 4/00* (2006.01)
*F21V 21/00* (2006.01)
(Continued)

(52) U.S. Cl.
CPC ... *F21S 8/02* (2013.01); *F21K 9/00* (2013.01); *F21V 23/005* (2013.01); *F21V 23/06* (2013.01);
(Continued)

(58) Field of Classification Search
CPC .............. F21V 23/003–23/006; F21V 23/008; F21V 23/06; F21K 9/00; F21K 9/30; F21K 9/54; F21S 8/02
USPC ............................................ 362/249.02, 247
See application file for complete search history.

(56) References Cited

U.S. PATENT DOCUMENTS 4,211,955 A 7/1980 Ray
4,399,492 A 8/1983 Kolesar
(Continued)

FOREIGN PATENT DOCUMENTS

JP 2000-348524 A 12/2000
JP 2001-338505 A 12/2001
(Continued)

OTHER PUBLICATIONS

Office Action received in corresponding U.S. Appl. No. 13/587,298 mailed on Jan. 18, 2013.
(Continued)

*Primary Examiner* — Jason Moon Han
(74) *Attorney, Agent, or Firm* — Banner & Witcoff, Ltd.

(57) ABSTRACT

A light-emitting module may be configured to have improved light emission efficiency and light distribution characteristics. A light-emitting module may include a substrate having a front surface side as a component mounting surface and a rear surface side as a flat heat dissipating surface, a plurality of light-emitting elements arranged in a manner protruding at a central portion of the component mounting surface of the substrate. The light-emitting elements may radiate light at least in an upper surface direction and in a direction along the component mounting surface. The module may further include one or more lighting circuit components electrically connected to the light emitting elements by a wiring pattern arranged on the substrate and which is arranged closer to the peripheral edge side of the substrate than the light emitting elements on the component mounting surface of the substrate, and a connector for power supply connection.

7 Claims, 8 Drawing Sheets

(51) Int. Cl.

| | | |
|---|---|---|
| F21S 8/02 | (2006.01) | |
| F21K 99/00 | (2010.01) | |
| F21V 23/00 | (2015.01) | |
| F21V 23/06 | (2006.01) | |
| F21V 29/00 | (2015.01) | |
| F21Y 101/02 | (2006.01) | |
| F21Y 105/00 | (2006.01) | |
| H05K 1/18 | (2006.01) | |

(52) U.S. Cl.
CPC ................. *F21K 9/30* (2013.01); *F21V 29/004* (2013.01); *F21Y 2101/02* (2013.01); *F21Y 2105/001* (2013.01); *H05K 1/181* (2013.01)

(56) References Cited

U.S. PATENT DOCUMENTS

| | | | |
|---|---|---|---|
| 4,666,545 | A | 5/1987 | DeGree et al. |
| 5,251,118 | A | 10/1993 | Budnovitch et al. |
| 5,495,147 | A | 2/1996 | Lanzisera |
| 5,526,236 | A | 6/1996 | Burnes et al. |
| 5,580,156 | A | 12/1996 | Suzuki et al. |
| 5,595,438 | A | 1/1997 | Burd |
| 5,655,830 | A | 8/1997 | Ruskouski |
| 5,726,535 | A | 3/1998 | Yan |
| 6,161,910 | A | 12/2000 | Reisenauer et al. |
| 6,435,459 | B1 | 8/2002 | Sanderson et al. |
| 6,527,411 | B1 | 3/2003 | Sayers |
| 6,558,021 | B2 | 5/2003 | Wu et al. |
| 6,595,656 | B2 | 7/2003 | Yoda |
| 6,791,840 | B2 | 9/2004 | Chun |
| 6,871,983 | B2 | 3/2005 | Jacob et al. |
| 6,903,457 | B2 | 6/2005 | Nakajima et al. |
| 6,926,524 | B2 | 8/2005 | Cao |
| 6,956,327 | B2 | 10/2005 | Nishio et al. |
| 6,997,576 | B1 | 2/2006 | Lodhie et al. |
| 7,238,967 | B2 | 7/2007 | Kuwabara et al. |
| 7,281,818 | B2 * | 10/2007 | You et al. ................ 362/241 |
| 7,292,513 | B2 | 11/2007 | Hu et al. |
| 7,396,142 | B2 | 7/2008 | Laizure, Jr. et al. |
| 7,488,097 | B2 | 2/2009 | Reisenauer et al. |
| 7,566,154 | B2 | 7/2009 | Gloisten et al. |
| 7,648,258 | B2 | 1/2010 | Shuai et al. |
| 7,794,115 | B2 | 9/2010 | Hellinger et al. |
| 7,808,189 | B2 | 10/2010 | Hollnberger et al. |
| 7,993,031 | B2 | 8/2011 | Grajcar |
| 8,174,196 | B2 | 5/2012 | Lin et al. |
| 2003/0048632 | A1 | 3/2003 | Archer |
| 2003/0085710 | A1 | 5/2003 | Bourgault et al. |
| 2003/0156410 | A1 | 8/2003 | Ter-Hovhannisian |
| 2003/0193802 | A1 | 10/2003 | Luk |
| 2004/0070990 | A1 | 4/2004 | Szypszak |
| 2004/0212321 | A1 | 10/2004 | Lys et al. |
| 2005/0073846 | A1 | 4/2005 | Takine |
| 2006/0268555 | A1 | 11/2006 | Kelly |
| 2007/0035951 | A1 | 2/2007 | Tseng |
| 2007/0081342 | A1 | 4/2007 | Szeto |
| 2007/0121328 | A1 | 5/2007 | Mondloch et al. |
| 2007/0230194 | A1 * | 10/2007 | Julia Vilarrasa ............ 362/373 |
| 2007/0236628 | A1 | 10/2007 | Epstein |
| 2008/0024070 | A1 | 1/2008 | Catalano et al. |
| 2008/0144316 | A1 | 6/2008 | Newton et al. |
| 2008/0285270 | A1 | 11/2008 | Chiang |
| 2009/0052186 | A1 | 2/2009 | Xue |
| 2011/0006680 | A1 | 1/2011 | Tanaka et al. |
| 2011/0038172 | A1 | 2/2011 | Vollmer et al. |

FOREIGN PATENT DOCUMENTS

| | | |
|---|---|---|
| JP | 2002-299700 A | 10/2002 |
| JP | 2003-59330 | 2/2003 |
| JP | 2003-068129 A | 3/2003 |
| JP | 2003-092011 A | 3/2003 |
| JP | 2006-011239 A | 1/2006 |

OTHER PUBLICATIONS

Office Action received in corresponding U.S. Appl. No. 13/227,133 mailed on Mar. 19, 2012.
Office Action received in corresponding U.S. Appl. No. 13/227,133 mailed Oct. 16, 2012.
Office Action received in corresponding U.S. Appl. No. 12/867,134 mailed Oct. 24, 2012.
Final Office Action received in U.S. Appl. No. 12/867,134 mailed Jul. 9, 2013.
Final Office Action received in U.S. Appl. No. 13/587,298 mailed Jul. 10, 2013.
Final Office Action received in U.S. Appl. No. 13/587,259 mailed Sep. 6, 2013.
Office Action received in corresponding Japanese Application # 2009-019855 dtd Jul. 6, 2012.
International Preliminary Report on Pantetability issued in PCT/JP2009/052382 on May 19, 2009.
International Search Report issued in PCT/JP2009/052382, mailed May 19, 2009.
Non-Final Office Action received in corresponding U.S. Appl. No. 13/587,259 mailed Mar. 7, 2013.
Non-Final Office Action received in corresponding U.S. Appl. No. 13/587,259 mailed Mar. 24, 2014.
Non-Final Office Action received in corresponding U.S. Appl. No. 12/867,134 mailed Mar. 26, 2014.
Non-Final Office Action received in corresponding U.S. Appl. No. 13/227,133 mailed Mar. 26, 2014.
Non-Final Office Action received in corresponding U.S. Appl. No. 13/587,298 mailed Apr. 1, 2014.
Final Office Action received in corresponding U.S. Appl. No. 12/867,134, mailed Jul. 9, 2014.
Non-Final Office Action received in corresponding U.S. Appl. No. 13/587,235, mailed Jul. 9, 2014.
Final Office Action received in corresponding U.S. Appl. No. 13/587,298, mailed on Jul. 18, 2014.
Final Office Action received in corresponding U.S. Appl. No. 13/227,133, mailed on Jul. 17, 2014.
Non-Final Office Action received in corresponding U.S. Appl. No. 13/587,278, mailed on Jul. 17, 2014.
Final Office Action received in corresponding U.S. Appl. No. 13/587,259, mailed on Jul. 17, 2014.
Dec. 4, 2014—(US) Non-Final Office Action—U.S. Appl. No. 13/227,133.
Dec. 16, 2014—(US) Non-Final Office Action—U.S. Appl. No. 13/587,298.
Jan. 5, 2015—(US) Final Office Action—U.S. Appl. No. 13/587,235.
Feb. 25, 2015—(US) Final Office Action—U.S. Appl. No. 13/587,278.
Mar. 18, 2015—(US) Final Office Action—U.S. Appl. No. 13/227,133.
Mar. 20, 2015—(US) Examiner's Answer to Appeal Brief—U.S. Appl. No. 12/867,134.
Mar. 25, 2015—(US) Examiner's Answer to Appeal Brief—U.S. Appl. No. 13/587,259.
May 27, 2015—(US) Final Office Action—U.S. Appl. No. 13/587,298.
Jun. 5, 2015 (US)—Non-Final Office Action—U.S. Appl. No. 13/587,235.

* cited by examiner

_US 9,273,838 B2_

LIGHT-EMITTING MODULE AND LIGHTING APPARATUS

CROSS-REFERENCE TO RELATED APPLICATIONS

This application is a continuation of application Ser. No. 12/867,134 entitled "LIGHT-EMITTING MODULE AND LIGHTING APPARATUS" and was filed on Sep. 23, 2010, which is a national stage entry of PCT Application No. PCT/JP2009/052382, filed on Feb. 13, 2009, and claims priority to Japanese Application No. 2008-118292, filed Apr. 30, 2008 and Japanese Application No. 2008-033673 filed Feb. 14, 2008. The contents of the above noted applications are incorporated by reference herein in their entirety.

TECHNICAL FIELD

Aspects of the present disclosure relate to a light-emitting module in which a light-emitting element such as LED is arranged. In some examples, aspects relate to a lighting apparatus provided with the light-emitting module.

BACKGROUND

In some known arrangements, LED chips and circuit components are disposed on a surface of the LED module in a mixed manner. Therefore, these known arrangements fail to disclose any technical idea for performing excellent distribution of light radiated from the LED chip, and moreover, there is no description of using a rear surface of the LED module as a heat dissipating surface. Furthermore, in some known configurations of a power feeding terminal and a holding member, the disclosed LED module has a specific structure for attachment and connection, which requires a specified adaptor, thus lacking versatility.

DETAILED DESCRIPTION

Aspects described herein relate to improving upon the above circumstances, and to provide a light-emitting module having excellent light emission efficiency and excellent light distribution characteristics and also provide a lighting apparatus using the light-emitting module.

A light-emitting module according to aspects described herein includes: a substrate having a front surface side constituted as a component mounting surface and a rear surface side constituted as a heat dissipating surface flat in shape; a plurality of light-emitting elements mounted at a central portion of a component mounting surface of the substrate in a manner protruding therefrom and emitting light at least in an upper surface direction and in a direction along the component mounting surface; a lighting circuit component which is electrically connected to the light emitting elements by a wiring pattern arranged on the substrate and which is arranged on a peripheral edge side of the substrate than the light emitting elements, on the component mounting surface of the substrate; and a connector for connecting with a power supply, which is arranged on the peripheral edge side of the substrate than the light emitting elements, on the component mounting surface of the substrate, and which is electrically connected to the lighting circuit component.

In some examples, a light emitting module having wide applicable range can be provided with excellent light distribution characteristics and made optimized. Moreover, heat dissipation effects can be promoted and the wiring pattern on the substrate can be shortened and simplified, thus being effective.

Furthermore, in some arrangements, it may be desired that the plurality of light-emitting elements are arranged at even intervals in rotational symmetry except at a central point of the central portion of the component mounting surface of the substrate. According to this arrangement, since the plurality of light emitting elements are arranged, it becomes possible to perform heat radiation in a concentrated manner from a portion near the center point of the substrate toward the rear surface side thereof, thus realizing substantially even light distribution characteristics in the horizontal direction.

Additionally or alternatively, it may be desired that when it is supposed that a minimum distance between light-emitting portions of the plurality of the light-emitting elements arranged is c, a width of the light-emitting portion on a line of the minimum distance c is a, and a height from the mounting surface of the substrate to an upper surface of the light-emitting portion is b, the light-emitting elements are arranged so as to satisfy a dimensional relationship of $b<c<4a$. According to this arrangement, the light-emitting module having suppressed luminance irregularity is obtainable, thus providing excellent light emission efficiency.

Figure 1:
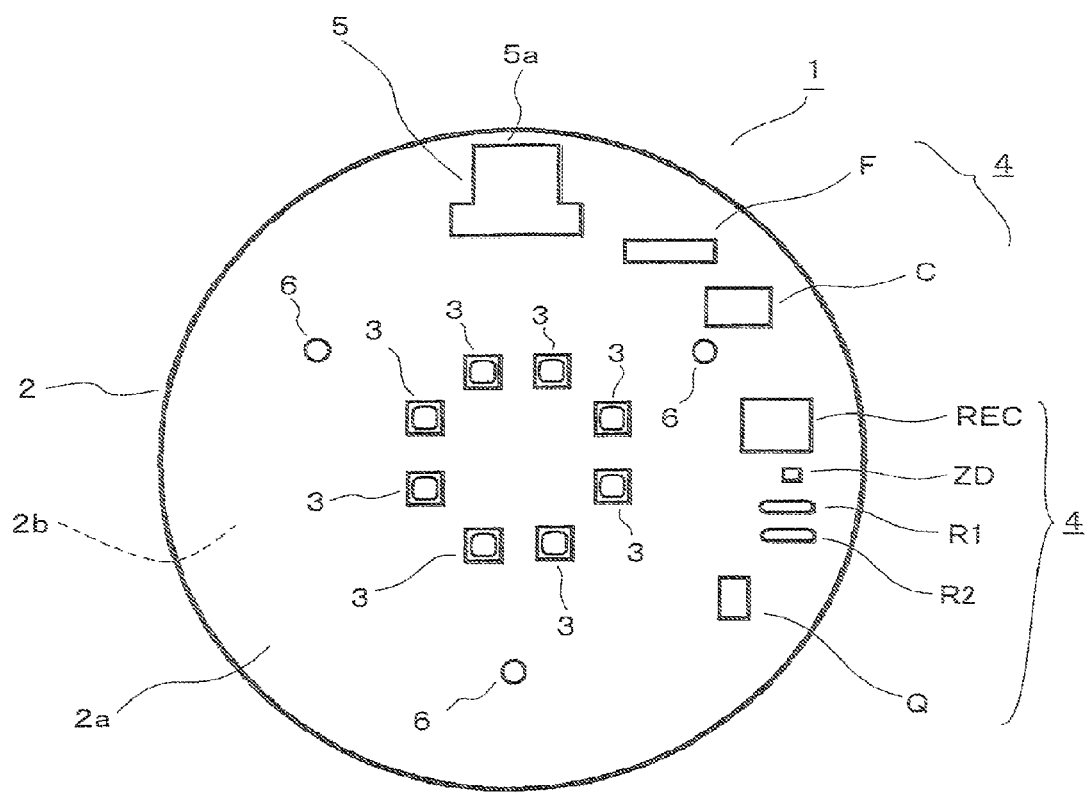
[FIG. 1] is a plan view illustrating a first embodiment of a light-emitting module according to the present invention.

A first embodiment of the present invention will be described below with reference to FIGS. 1 to 3. FIG. 1 is a plan view illustrating a light-emitting module, FIG. 2 is a partial enlarged side view illustrating a light-emitting element, and FIG. 3 is a circuit diagram of the light-emitting module.

Referring to FIG. 1, a light-emitting module 1 includes a disc-shaped substrate 2, light-emitting elements 3 mounted on the substrate 2, a lighting circuit components 4, and a connector 5 for power source connection.

The substrate 2 is made of aluminum, which is formed into a disc plate shape, and having a thickness of about 1.5 mm and a diameter of about 70 mm. In the substrate 2, a front surface side 2a is used as a component mounting surface, and a rear surface side 2b is used as a flat-shaped heat dissipating surface. On the component mounting surface, eight light-emitting elements 3 are mounted in a manner concentrated in the central portion of the component mounting surface in a pattern spaced with a predetermined interval from each other. When the substrate 2 is made of metal, it is preferred to use a material such as aluminum or copper which is excellent in heat conductivity and heat dissipation characteristics. On the other hand, when an insulating material is used for the substrate 2, a synthetic resin material or a ceramic material containing thermal conduction filler, which has relatively excellent heat dissipation characteristics and excellent durability, may be utilized. In the case of using the synthetic resin material, the substrate 2 may be formed of glass epoxy resin or the like. Further, the shape of the substrate 2 is not limited to circle and may be quadrangle or polygon.

Figure 2:
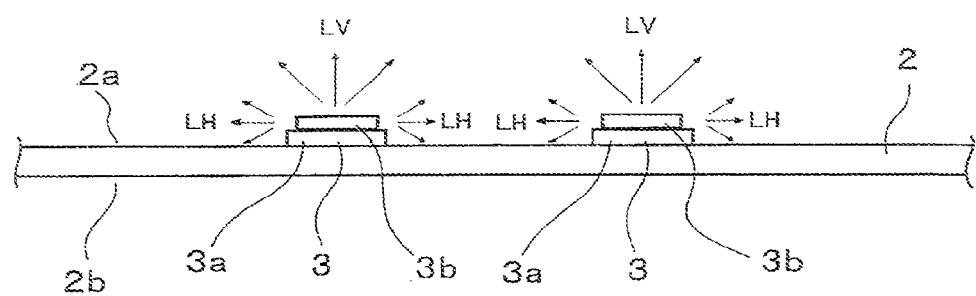
[FIG. 2] is a partial side view, in an enlarged scale, illustrating the light-emitting module according to the present invention.
Figure 3:
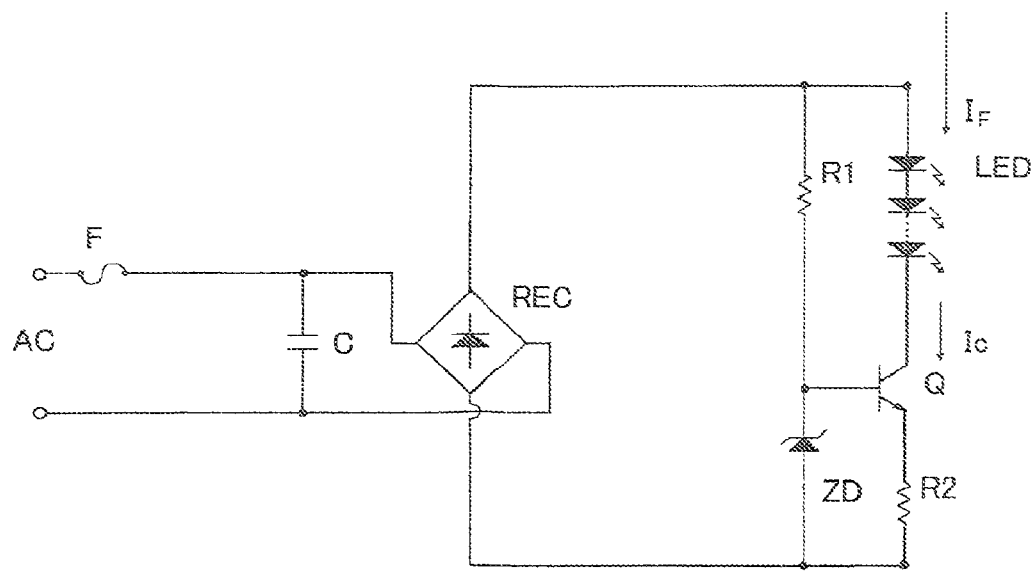
[FIG. 3] is a circuit diagram of the light-emitting module according to the present invention.

The light-emitting elements 3 are a surface-mounted LED package and are mainly constituted of a main body 3a formed of ceramic, an LED chip mounted on the main body and a translucent resin 3b for mold use, such as epoxy resin or silicon resin, which seals the LED chip (refer to FIG. 2). A pair of lead terminals, not shown, connected to the LED chip projects from the main body 3a in a horizontal direction. In the LED package, four LED chips are mounted, which are connected in series between electrodes of the package, and accordingly, since eight LED packages each having four LED chips are arranged, totally, thirty two (32) LED chips are arranged. Needless to say, an LED package may also be used in which a single LED chip is mounted.

The LED chip is a blue LED chip emitting blue light. The translucent resin 3b for mold use contains a fluorescent material which absorbs light emitted by the LED chip and generates yellow light. The LED chip is molded on an upper surface of the main body 3a so as to form a flat plate with a predetermined thickness. Accordingly, light from the LED chip is irradiated from an upper surface and a side surface of the translucent resin 3b of the LED package to the outside, and hence, the light from the LED chip has a white-base luminescent color such as white color or electric bulb color and has wide light distribution characteristics. That is, light is irradiated from the light-emitting elements 3 in a direction of the upper surface thereof and in a direction along the component mounting surface. Further, the LED package is about 3.5 mm in breadth, 3.5 mm in width and 1.5 mm in height and has a shape of a substantially rectangular solid.

An insulating layer is formed on a surface of the substrate 2, and on such insulating layer, a connection land connected to lead terminals of the surface-mounted components and a wiring pattern, not shown, are formed. In the central portion of the substrate 2 except at a central point thereof, the light-emitting elements 3 are arranged at a predetermined interval (3 mm to 15 mm, preferably 5 mm to 10 mm) in rotational symmetry (in the present embodiment, being 45.degree. symmetry relative to the light emission center of the light-emitting elements 3) around the central point along a direction of the front surface of the substrate 2. Further, the lighting circuit components 4 are arranged and mounted in an outer peripheral edge side of the substrate 2, and in this case, the lighting circuit components 4 are never mounted between the light-emitting elements 3 and 3. The lighting circuit components 4 are used for lighting control of the LED chip, and include a fuse F, a capacitor C, a rectifier REC, a constant voltage diode ZD, resistors R1 and R2, and a transistor Q. A connector 5 for connecting with a power supply is similarly arranged in a position around the light-emitting elements 3. The connector 5 is arranged so that a connection opening 5a thereof faces the outer peripheral edge of the substrate 2 and is disposed close to the outer peripheral edge. This is for the purpose of facilitating the connection with a power line of commercial power supply. The lighting circuit components 4 and the connector 5 are disposed closer to the outer peripheral edge side of the substrate 2 than the light-emitting elements 3, and arranged not in a dispersed manner but in a relatively concentrated manner (in a region disposed approximately ⅓ from the outer circumference of the substrate 2) to shorten the wiring pattern of the substrate 2. On the mounting surface of the substrate 2, a white resist having a high reflectivity is printed, and three screw through-holes 6 are formed on the mounting surface to be mounted onto an apparatus or the like.

The light-emitting elements 3 protrude from the mounting surface of the substrate 2 in a direction of height, and radiate, as indicated by the arrow in FIG. 2, light in a radial pattern from a protruding portion of the translucent resin 3b. Accordingly, not only the light LV radiated in a direction perpendicular (upper surface direction) to the mounting surface, but also the light LH radiated from the side surface of the translucent resin 3b of the LED package along the component mounting surface can be used.

Referring to the circuit diagram of FIG. 3, the capacitor C is connected via the fuse F across a commercial power supply AC. The full-wave rectifier REC is connected across the capacitor C, and in the output terminal of the full-wave rectifier REC, a series circuit of the resistor R1 and the constant voltage diode ZD, and a series circuit of a plurality of the LED chips LED, the NPN transistor Q and the resistor R2 are connected in parallel. A base of the transistor Q is connected to a connecting point between the resistor R1 and the constant voltage diode ZD. In the LED package, four LED chips are, as described above, connected in series, and hence, a series circuit of the transistor Q and the resistor R2 may be constructed for each of the LED packages and then connected in parallel with each other.

A constant current circuit is constituted by the circuit mentioned above, and a current supplied from the commercial power supply AC is converted to a DC current, and such DC current flows, as constant current IF, in the series circuit of the LED chips LED, the transistor Q and the resistor R2. More specifically, a base voltage VB of the transistor Q is kept constant by the constant voltage diode ZD so that current IC flowing into a collector of the transistor Q is kept constant, and as a result, the current IF flowing in the LED chip is made constant.

According to the present embodiment described above, the light-emitting elements 3 are arranged in the central portion of the component mounting surface of the substrate 2, and the lighting circuit components 4 and the connector 5 for connecting with power supply are arranged around the light-emitting elements 3. Accordingly, the light LH radiated from the side surface of the light-emitting elements 3, i.e., the LED packages, can be effectively used, making excellent light distribution and also optimizing light distribution. That is, when the light-emitting elements 3, the lighting circuit components 4 and the connector 5 for connecting with power supply are arranged in a mixed manner, particularly, the light LH radiated from the side surface of the LED package is interrupted by the lighting circuit components 4 and the like, thus lowering light extraction factor of the radiant light, not allowing effective use of the radiant light, lowering the lighting efficiency and adversely affecting the optimization of light distribution.

According to the present embodiment, the lowering of light extraction factor of the radiant light by the lighting circuit components 4 and the like is reduced, and hence, the light LH radiated from the side surface can be effectively used. For example, when a reflector is used, the radiant light LH may be radiated in a direction of a surface to be irradiated. In addition, the light-emitting elements 3, the lighting circuit components 4 and the connector 5 for connecting with power supply are arranged in a concentrated manner, and as a result, the wiring pattern of the substrate 2 is shortened and simplified.

Further, since the light-emitting elements 3 as the heat sources are not arranged at the central portion of the substrate 2, and a rear surface side is formed as a flat heat dissipating surface, when the heat dissipating surface is in contact with another heat dissipating member, the heat is effectively transmitted from the central portion of the substrate 2 to the rear surface side, thereby easily realizing a configuration improving the heat dissipation effects.

Furthermore, since a modular structure including the connector 5 for connecting with power supply is achieved, a lighting apparatus can be provided merely by incorporating the substrate module 1 in the apparatus body and then connecting a commercial power supply to the connector 5. Thus, the light-emitting module 1 can be handled as a single common part having a wide applicable field. Furthermore, since the connector 5 is arranged so that the connection opening 5a thereof is disposed close to the outer peripheral edge of the substrate 2, the connection with a power line of a commercial power supply is readily made, and in addition, since the white resist is printed on the mounting surface of the substrate 2, the excellent reflection efficiency can be provided.

Hereunder, a first embodiment of a lighting apparatus according to the present invention will be described with reference to FIG. 4.

Figure 4:
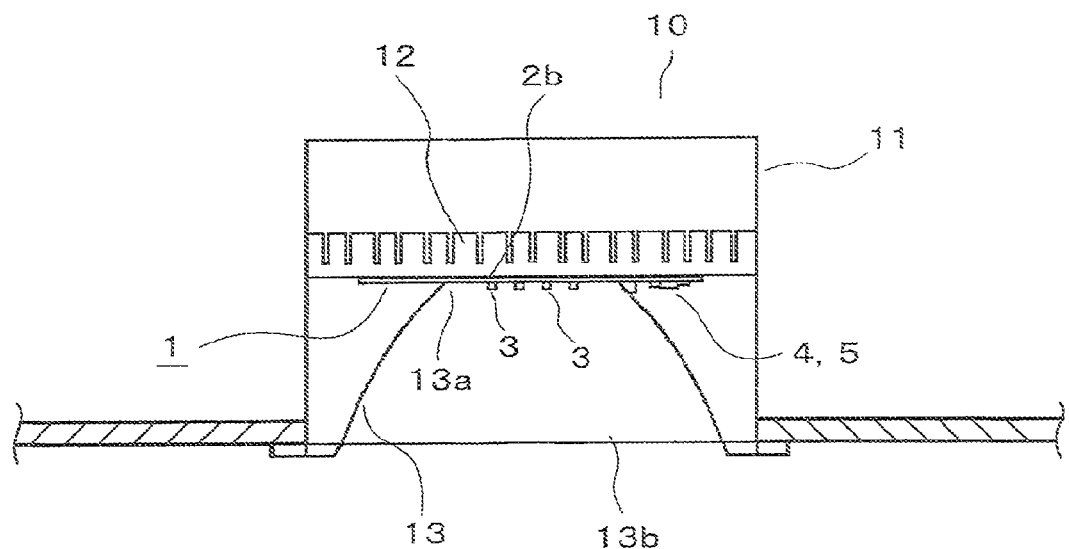
[FIG. 4] is a schematic diagram illustrating a structure of a first embodiment of a lighting apparatus according to the present invention.

FIG. 4 is an illustration showing schematic structure of a lighting apparatus. Referring to FIG. 4, a lighting apparatus 10 is, for example, a downlight and includes an apparatus body 11. Included in the apparatus body 11 are a heat dissipating member 12 made of metal having heat dissipating fins, a light-emitting module 1 attached to the heat dissipating member 12, and a reflector 13. The light-emitting module 1 is screwed to the heat dissipating member 12 so that a heat dissipating surface on a rear surface side 2b of the substrate 2 is closely attached to the heat dissipating member 12 through a silicon rubber sheet. Needless to say, this mounting of the light-emitting module 1 may be made by means of bonding or the like, instead of screw fastening. The reflector 13 has a shape of a bowl having a gently curved surface and has an opening in its upper and lower ends. The upper end constitutes a mounting opening 13a, and the lower end constitutes a radiating opening 13b.

As for the positional relationship with the light-emitting module 1, i.e., the positional relationship with the component mounting surface of the substrate 2, the mounting opening 13a of the reflector 13 is disposed so as to separate the light-emitting elements 3 from the lighting circuit components 4 and the connector 5 for connecting with power supply, arranged around the light-emitting elements 3. That is, the light-emitting elements 3 are divided from the lighting circuit components 4 and the like by the reflector 13. Thus, the light radiated from the light-emitting elements 3 is not interrupted by the lighting circuit components 4 and the like and is reflected on the reflector 13 and radiated downward. Further, since the lighting circuit components 4 are not seen from the front surface side of the reflector 13, the outer appearance of the lighting apparatus 10 can be also improved.

According to the present embodiment, there is provided the lighting apparatus 10 capable of achieving more effective distribution of the radiant light from the light-emitting elements 3 in addition to the above described effects of the light-emitting module 1.

The lighting apparatus is not limited to the above embodiment, and the light-emitting module 1 may be mounted in a light source having a cap, or may be incorporated in lighting equipment used indoors or outdoors.

A second embodiment of the lighting apparatus according to the present invention will be described hereunder with reference to FIG. 5.

In this embodiment, a downlight type lighting apparatus, using an electric-bulb shaped LED lamp as the light source, is shown.

Figure 5:
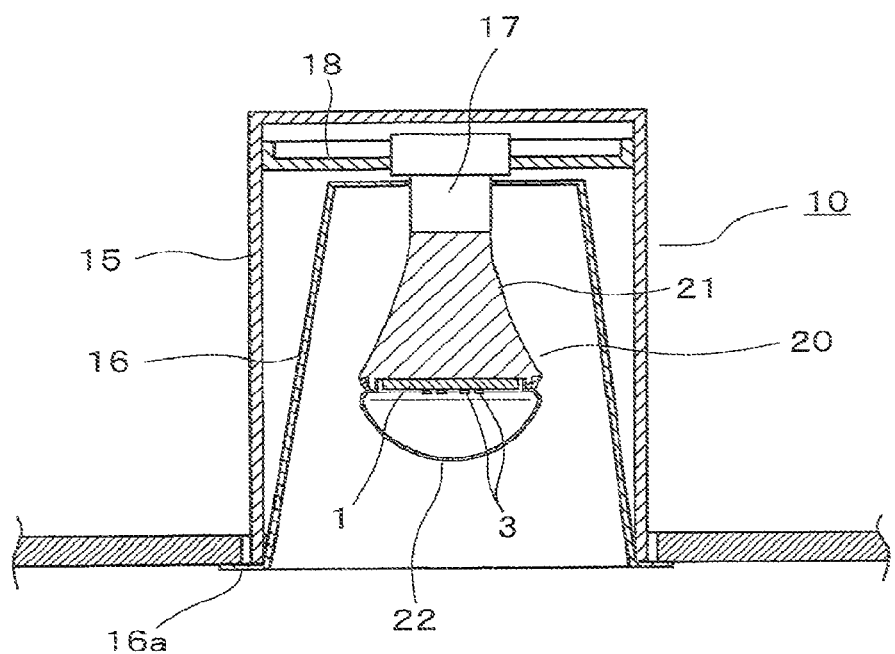
[FIG. 5] is a schematic diagram illustrating a structure of a second embodiment of the lighting apparatus according to the present invention.

Referring to FIG. 5, the lighting apparatus mounted on a ceiling surface includes an apparatus body 10 and a light source 20 having a shape of an electric bulb, mounted to the apparatus body 10.

The light source 20 includes: a light-emitting module 1 according to the first embodiment having the light-emitting elements 3 mounted thereon; a main body 21 thermally coupled to the light-emitting module 1 and working as a heat dissipating member; and a glove 22 attached, through an insulating member, to the main body 21 so as to cover, for example, a cap of E26 and the light-emitting module 1.

The apparatus body 10 includes a case 15 made of metal and having a box-shaped structure having an opening in formed in a lower surface thereof, and a reflector 16 made of metal fitted into the opening of the case 15. The reflector 16 is formed by a metal plate of aluminum or the like, for example, and a decorative frame 16a is formed to a peripheral portion of the lower surface of the reflector 16. A socket 17, in which the cap of the light source 20 is screwed, is arranged at the center of an upper surface plate of the reflector 16. The socket 17 is attached to the case 15 via a support plate 18 secured to the inner side of the case 15.

According to the present embodiment, there is provided a lighting apparatus with an LED lamp in the shape of an electric bulb, which achieves the effects mentioned above with reference to the light-emitting module 1.

Figure 6:
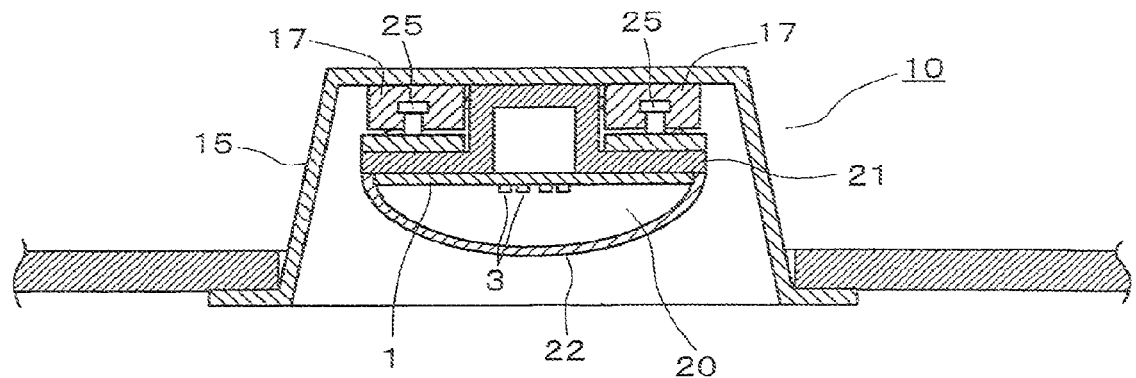
[FIG. 6] is a schematic diagram illustrating a structure of a third embodiment of the lighting apparatus of the present invention.

A third embodiment of the lighting apparatus according to the present invention will be described hereunder with reference to FIG. 6. The like reference numerals are applied to portions or elements corresponding to those of the second embodiment, and repeated explanation thereof is omitted herein.

In this embodiment, there is provided a lighting apparatus illustrated as a downlight, using a thin LED lamp, as a light source 20, having thickness smaller in a height direction of height. The light-emitting module 1 of the first embodiment is mounted in the light source 20 in a similar manner, and a main body 21 functioning as a heat dissipating member is thermally coupled to the light-emitting module 1. A cap is provided with a connecting pin 25 formed into GX53-shape. A socket 17 is mounted to a case 15, and connecting pins 25 for the cap are electrically and mechanically connected to the socket 17.

According to the present embodiment described above, there is provided a lighting apparatus with a thin-type LED lamp capable of achieving the effects of the light-emitting module 1.

Figure 7:
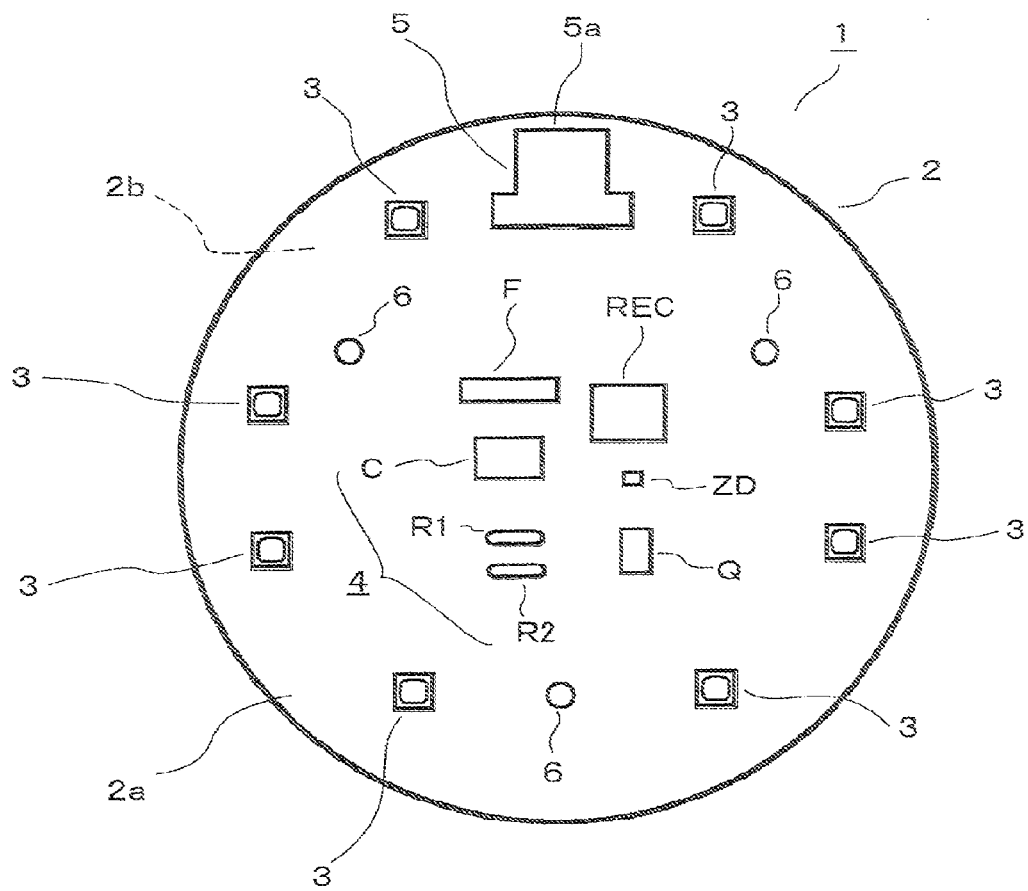
[FIG. 7] is a plan view illustrating a modification of the light-emitting module according to the first embodiment.

A modification of the light-emitting module according to the first embodiment will be described hereunder with reference to FIG. 7. FIG. 7 is a plan view illustrating a light-emitting module. The like reference numerals are added to portions or elements corresponding to those of the first embodiment, and repeated explanation thereof is omitted herein.

Lighting circuit components 4 are mounted on a component mounting surface of a substrate 2 in a manner concentrated in the central portion thereof. The lighting circuit components 4 include a fuse F, a capacitor C, a rectifier REC, a constant voltage diode ZD, resistors R1 and R2, and a transistor Q.

On the other hand, the light-emitting elements 3 are mounted around the lighting circuit components 4 in a pattern spaced with a predetermined interval from each other. In a connector 5 for power supply connection is arranged so that a connection opening 5a thereof is disposed close to the outer peripheral edge of the substrate 2. In consideration of the connection with a power line, although it is preferred that the connector 5 for the power supply connection is disposed to a portion in the vicinity of the outer periphery of the substrate 2, the connector may be arranged at the central portion together with the lighting circuit component 4.

In this modified embodiment, the positional arrangement of the light-emitting elements 3 and the lighting circuit components 4 of the first embodiment are reversed, and since the mounting interval of the light-emitting elements 3 is greater than that of the first embodiment, light LH radiated from the side surface of the LED package can be effectively utilized as like as in the first embodiment, and in addition, by increasing the interval between the light-emitting elements 3, 3 . . . , the heat of the light-emitting elements 3 can be transmitted and dissipated to the rear side of the substrate 2 by effectively utilizing the entire structure of the substrate 2.

Hereunder, there will be explained an embodiment, with reference to FIGS. 8 to 13, in which the interval between the plurality of light-emitting elements 3, 3, . . . mounted on the substrate 2, and degree of luminance irregularity and variation in light-emitting efficiency both dependent on the interval, have been studied with respect to the light-emitting module 1 according to the first embodiment.

Referring to FIG. 8, the light-emitting elements 3 constitute a surface-mounted LED package and are composed of a main body 3a, an LED chip mounted on the main body 3a, and a translucent resin 3b for sealing the LED chip, and this translucent resin 3b functions as a light-emitting unit L.

Figure 8B:
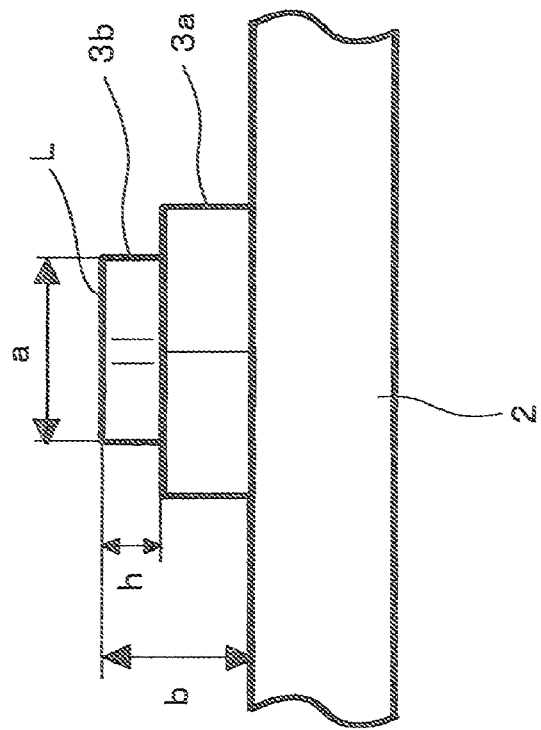
[FIG. 8] is a plan view (8(*a*) and a side view 8(*b*)) illustrating the light-emitting element (LED package) according to the first embodiment of the light-emitting module.
Figure 8A:
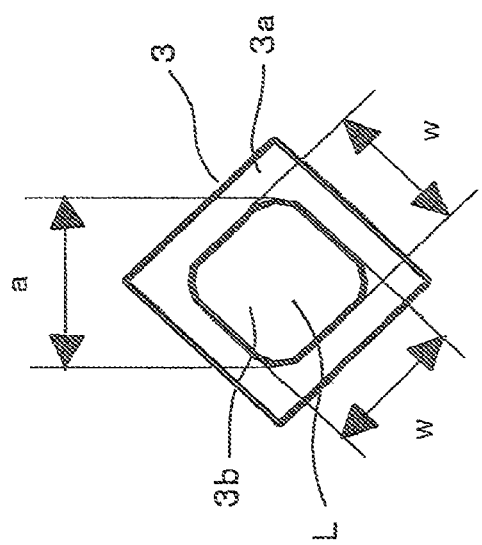

The light-emitting unit L is, as illustrated in FIG. 8(a), formed so as to have a substantially quadrate shape which is 2.8 mm on a side (W) and about 4 mm on a diagonal (a). As illustrated in FIG. 8(b), the light-emitting element 3 mounted on the substrate 2 is 1.5 mm in height (b) from the mounting surface of the substrate 2 to an upper surface of the light-emitting unit L and is 0.7 mm in height (h) of the light-emitting unit L.

Figure 9:
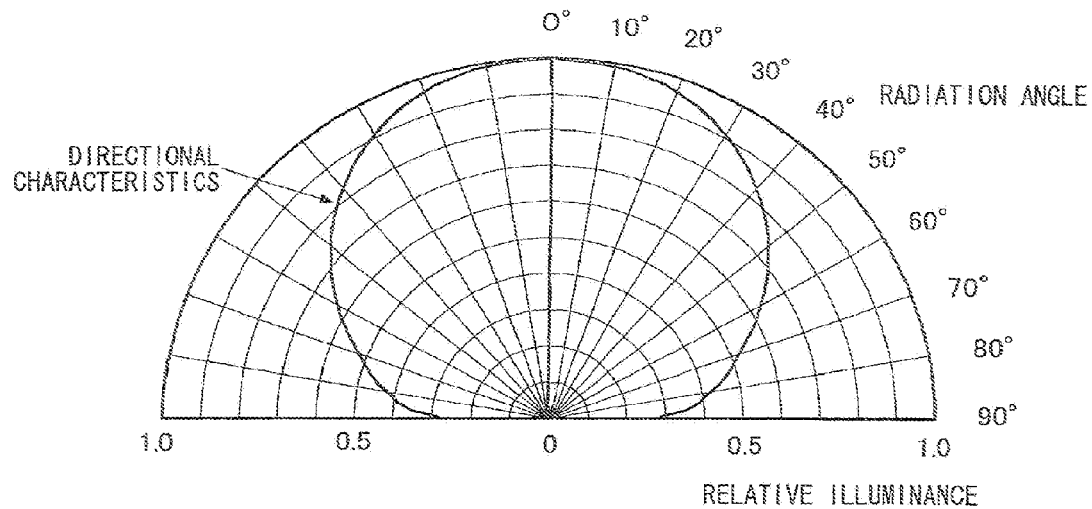
[FIG. 9] is a graph showing a directional pattern of radiant light of the light-emitting element.

FIG. 9 is a graph showing a directional characteristics or pattern of the light-emitting elements 3. The light-emitting element 3 has a maximum illuminance in a direction perpendicular to the upper surface, i.e., at a radiation angle of 0.degree., and as for a direction of the side surface, has a illuminance 40 percent or greater relative to the maximum illuminance at a radiation angle of 80.degree. and a illuminance 50 percent or greater relative to the maximum illuminance at a radiation angle of 70.degree., thus radiating a given amount of light in a direction along the component mounting surface.

Figure 10:
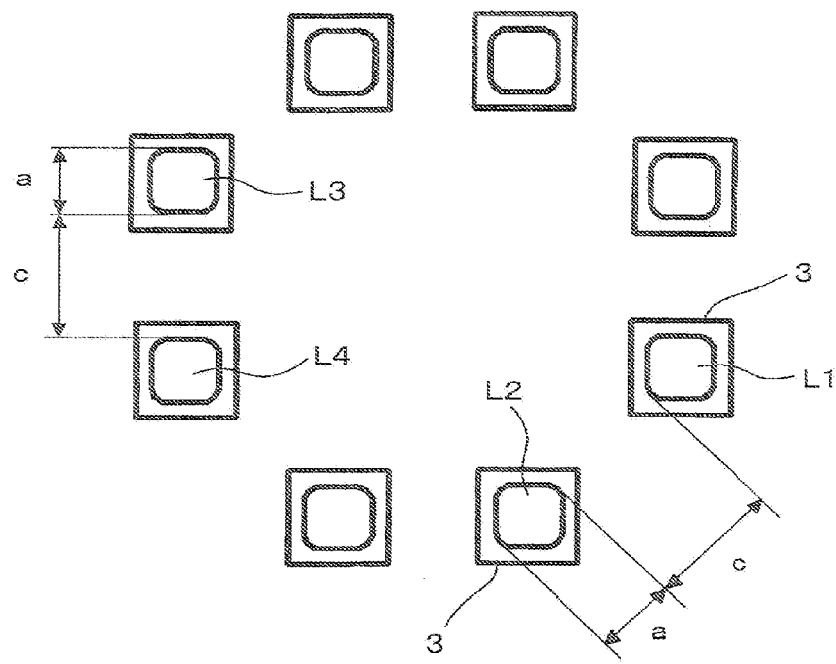
[FIG. 10] is a plan view illustrating an arrangement of the light-emitting elements.

The light-emitting elements 3 having such configuration and characteristics were arranged in a pattern spaced at a predetermined interval from each other as shown in FIG. 10.

Thereafter, luminance irregularity and light-emitting efficiency were measured and evaluated by changing the interval.

Figure 11:
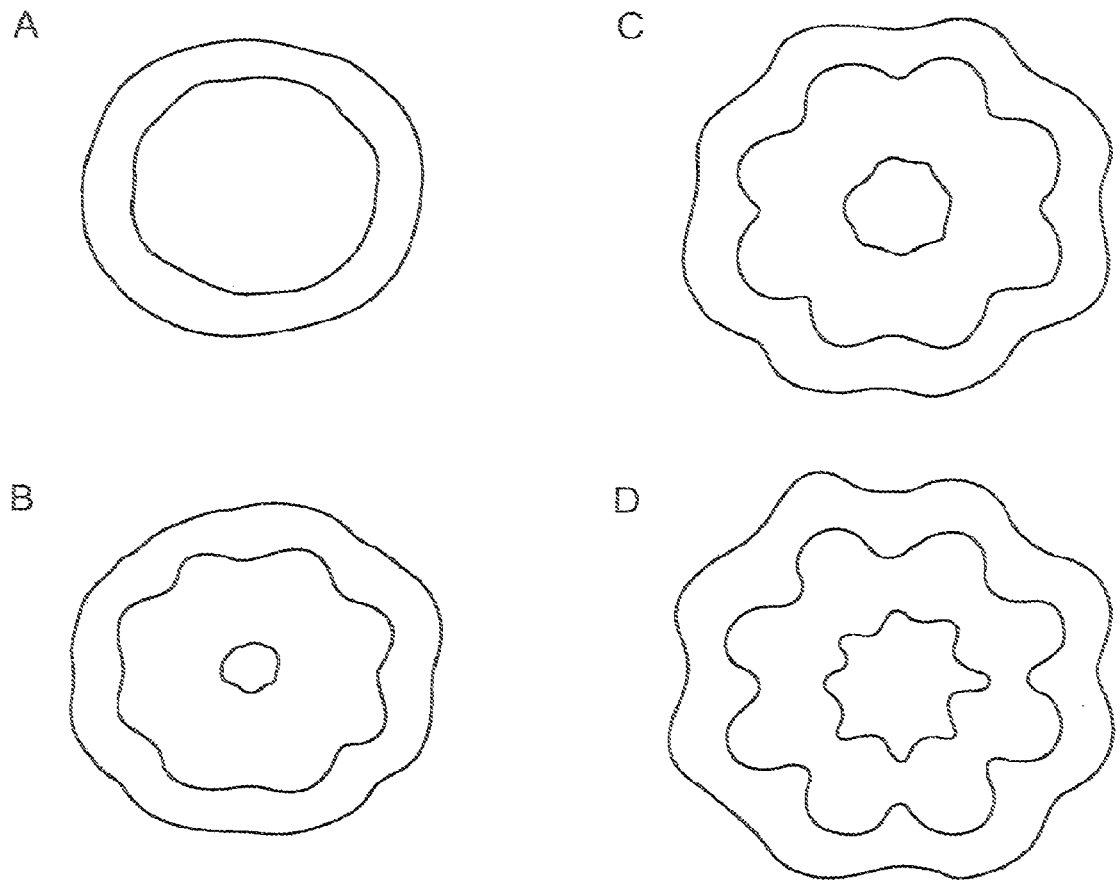
[FIG. 11] is a schematic view showing illuminance distribution on a floor surface when the light-emitting module is lightened.

Here, it was supposed, as illustrated in FIG. 10, that character c denotes a minimum distance between the light-emitting units L1 and L2, and character a denotes a width of the light-emitting units L1 and L2 on a line of the minimum distance c. The method of evaluating luminance irregularity was made such that the light-emitting module 1 was made to glow at a height of 2.5 m from the floor surface to illuminate the floor surface, and the state of illumination on the floor was observed to perform visual evaluation. This visual evaluation was, as illustrated in FIG. 11, performed by observing illuminance distribution on the floor. Further, FIG. 11 is a figure that schematically illustrates, with the solid line, a boundary line at which illuminance difference appears, more specifically, an image of light-emitting pattern (mounting pattern image of the light-emitting elements 3) of the light-emitting elements 3. Thus, the evaluation is ranked as follows. In pattern A, luminance irregularity is not noticed at all, in pattern B, luminance irregularity is hardly noticed, in pattern C, luminance irregularity is noticed, and in pattern D, luminance irregularity is clearly observed. Roughly speaking, when the interval between the light-emitting units L of the light-emitting elements 3 is small, the luminance irregularity may be eliminated, the adjacent light-emitting elements 3 interrupt the radiant light, thus lowering light emission efficiency. On the other hand, when the interval between the light-emitting units L is wide, the light emission efficiency becomes high, but the luminance irregularity tends to occur.

Figure 12:
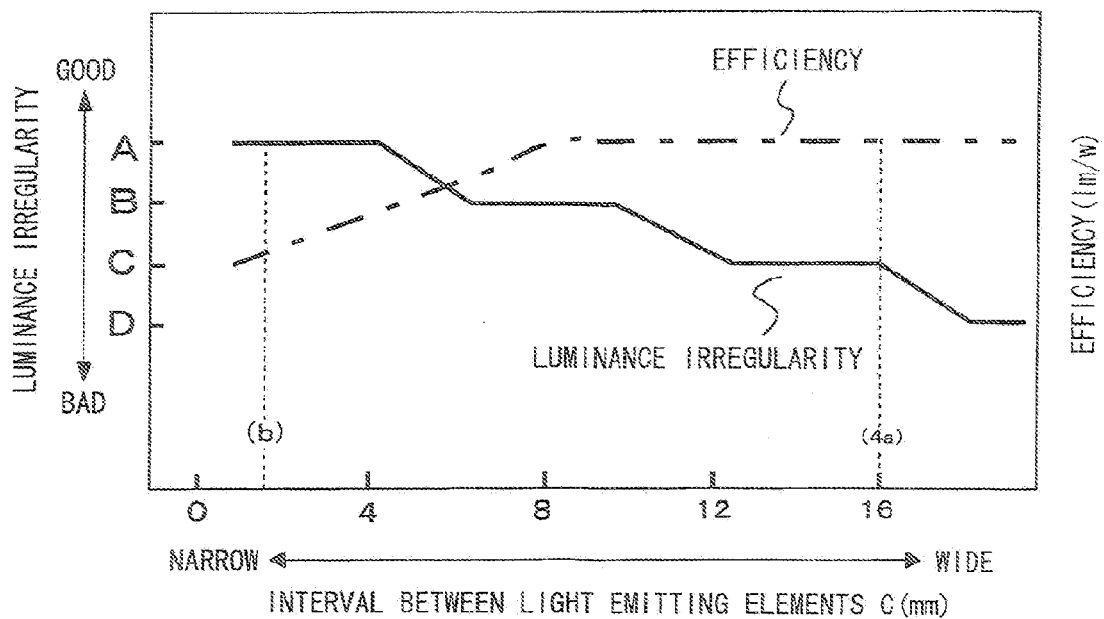
[FIG. 12] is a graph representing luminance irregularity and light emitting efficiency relative to the interval between the light-emitting elements.

As a result of the above evaluation and measurement, evaluation and measurement values were obtained as shown in FIG. 12. Referring to FIG. 12, the abscissa indicates interval c between the light-emitting units L of the light-emitting elements 3, and the ordinate indicates luminance irregularity evaluation and measurement values of light emission efficiency. Further, it was found that as the interval c exceeded 4 mm, the luminance irregularity gradually lowered and deteriorated and that as the interval c increased, the light emission efficiency raised. However, when the interval c exceeded 8 mm, it was found that the light emission efficiency saturated.

In consideration of the above results, it was confirmed that the permissible range of luminance irregularity lied around rank C, and in consideration of the light emission efficiency, it was also confirmed that the interval c between the light-emitting elements 3 was preferably greater than b and smaller than $4a$ ($b<c<4a$). Furthermore, it was resulted that the optimum range in the above range for further enhancing luminance irregularity evaluation and improving the light emission efficiency was a range of $2b.ltoreq.c.ltoreq.3a$. Still furthermore, in order to suppress effect due to heat generation between the light-emitting elements 3, an optimum arrangement pattern was $a<c$. In the case of $a<c$, the temperature of the light-emitting elements 3 during glowing could be suppressed from rising. A lower limit value of the above interval c may also be represented by height h of the light-emitting unit L, and when this height h is used, a relationship of approximately $2h<c$, preferably, $4h.ltoreq.c$ will be obtained.

In the above, the present embodiment, was described with reference to as an example by considering the relationship between the light-emitting units L1 and L2 of the light-emitting elements 3 illustrated in FIG. 10. However, for example, the dimensional relationship of the interval c in the light-emitting units L2 and L3 is similar to that of the light-emitting units L1 and L2. The dimensions, the directional characteristics and the like of the light-emitting elements 3 are not limited to the specific dimensions and characteristics described with reference to this embodiment. The mounting pattern of the light-emitting elements 3 is not limited to the pattern in which light-emitting elements 3 are, as illustrated in FIG. 10, arranged on the circumference, and it may be sufficient that minimum distance c between the light-emitting elements 3 falls into the above prescribed range. For example, the light-emitting elements 3 may be arranged in a matrix pattern.

Figure 13:
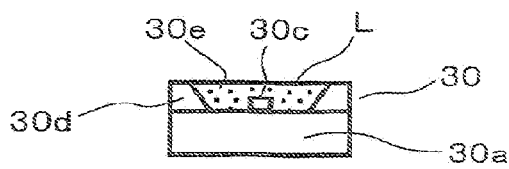
[FIG. 13] is an explanatory view illustrating an example of another application of the light-emitting element.

A light-emitting element 30 illustrated in FIG. 13 may also be used as the light-emitting element. This light-emitting element 30 is a surface-mounted LED package, and this LED package is composed of a main body 30a formed of ceramics, a reflector 30d arranged on the main body 30a, an LED chip 30c mounted in a recess defined by the main body 30a and the reflector 30d, and a silicon resin 30e for sealing the LED chip 30c. This silicon resin 30e functions as the light-emitting unit L, and light is radiated from the light-emitting unit L in a radial pattern which is similar, as a whole, to the directional characteristics illustrated in FIG. 9, including an upper surface direction and a direction along the component mounting surface.

INDUSTRIAL APPLICABILITY

According to the present invention, there is provided a light-emitting module having a wide applicable scope and improving and optimizing the distribution of light radiated from the light-emitting element. In addition, the heat dissipation effects can be raised, and an effect of shortening and simplifying a wiring pattern on a substrate can be also achieved.

The invention claimed is:

1. A lighting device comprising:
   a mounting surface having a central portion, wherein a plurality of through-holes are formed in the mounting surface;
   at least one light emitting element each comprising an LED chip and a translucent resin sealing the LED chip, the at least one light emitting element mounted in a central portion of the mounting surface such that the plurality of through-holes are closer to a peripheral edge of the mounting surface than all light emitting elements mounted on the mounting surface;
   a connector mounted on the mounting surface and mounted closer to the peripheral edge of the mounting surface than the plurality of through-holes, the connector configured to connect with a power supply disposed separately from the mounting surface;
   at least one lighting circuit component mounted on the mounting surface and mounted closer to the peripheral edge of the mounting surface than the all light emitting elements; and
   a reflector having a curved surface of a truncated cone shape, the reflector further having a single mounting opening and a single radiating opening at respective ends of the curved surface of the truncated cone shape, and the reflector mounted on the mounting surface via the through-holes,
   wherein the single mounting opening separates all light emitting elements from the connector and the at least one lighting circuit component, and wherein the at least one lighting circuit component is mounted on the mounting surface such that, in a direction parallel to the mounting surface, the at least one lighting circuit component is positioned closer to a center of the mounting surface than a circumferential edge of the radiating opening.

2. The lighting device of claim 1, wherein the at least one light emitting elements includes a plurality of light emitting elements.

3. The lighting device of claim 1, wherein three through-holes are formed in the mounting surface.

4. The lighting device of claim 3, wherein the through-holes extend through an entire depth of a mounting body corresponding to the mounting surface.

5. The lighting device of claim 1, wherein the plurality of through-holes are formed closer to a center of the mounting surface than a position at which the at least one lighting circuit component is mounted.

6. The lighting device of claim 1, wherein an inner circumferential edge of the single reflector mounting opening contacts the mounting surface.

7. The lighting device of claim 1, wherein no portion of the reflector is disposed between, in a radial direction of the reflector, any two light emitting elements.

* * * * *